United States Patent [19]

Roch

[11] 4,034,293
[45] July 5, 1977

[54] MICRO-CIRCUIT TEST PROBE
[75] Inventor: Jacques Leon Roch, San Jose, Calif.
[73] Assignee: Electroglas, Inc., Santa Clara, Calif.
[22] Filed: May 8, 1975
[21] Appl. No.: 575,970

Related U.S. Application Data

[63] Continuation of Ser. No. 447,865, March 4, 1974, which is a continuation-in-part of Ser. No. 436,844, Jan. 28, 1974, Pat. No. 3,939,414.

[52] U.S. Cl. .......................... 324/158 P; 324/72.5
[51] Int. Cl.² ................... G01R 1/06; G01R 31/02
[58] Field of Search .......... 324/158 P, 158 F, 72.5, 324/149

[56] References Cited
UNITED STATES PATENTS 3,551,807   12/1970   Kulischenko et al. ......... 324/158 P
3,648,169   3/1972   Wiesler .......................... 324/158 P Primary Examiner—Rudolph V. Rolinec
Assistant Examiner—Ernest F. Karlsen
Attorney, Agent, or Firm—Ellsworth R. Roston

[57] ABSTRACT

A probe for testing integrated circuit components which includes a dielectric support body, conductive arms supported by the body and with the arms including a longer arm and a shorter arm. The shorter arm is positioned above the longer arm in spaced relation thereto with each arm having an outer end connected to a conductive probe tip. The probe tip includes a downwardly positioned point for contact with a surface having an integrated circuit defined thereon and contact means are provided which cooperate with the arms and tip to transmit an electrical signal to the tip or receive a signal from the tip.

19 Claims, 12 Drawing Figures

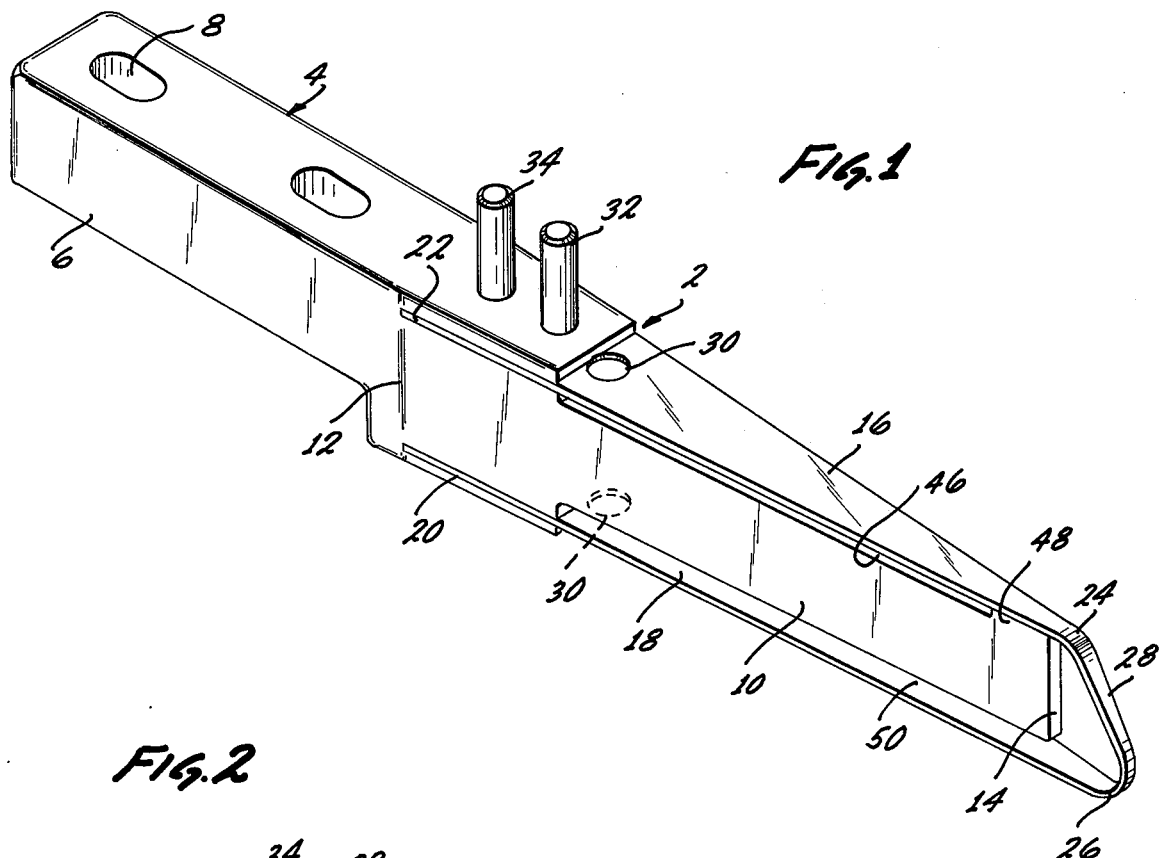
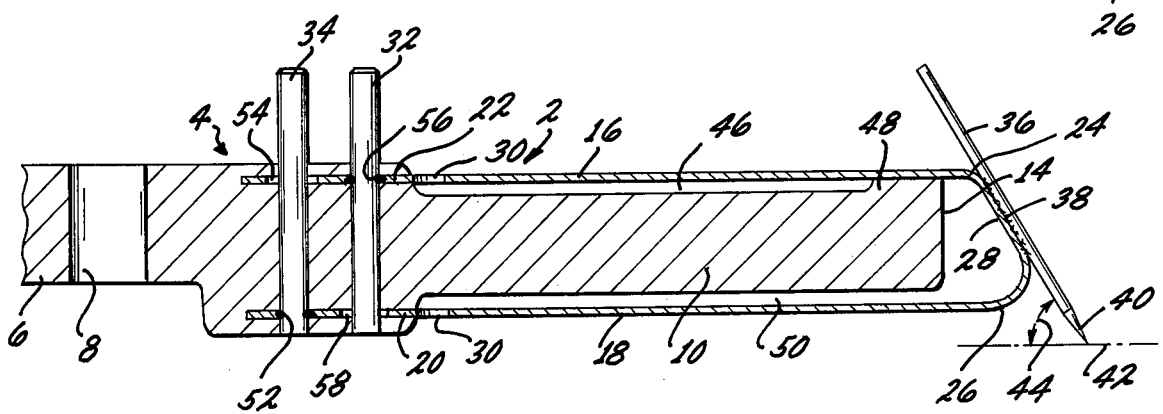
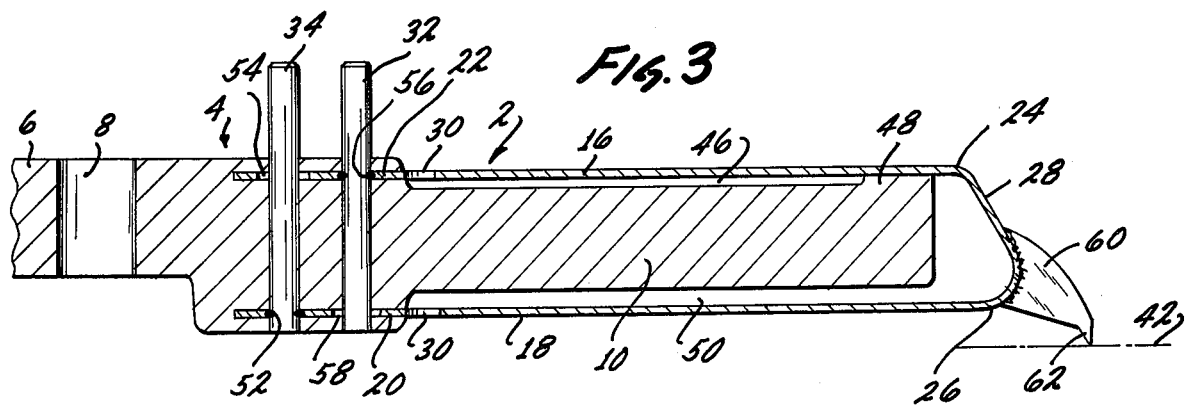

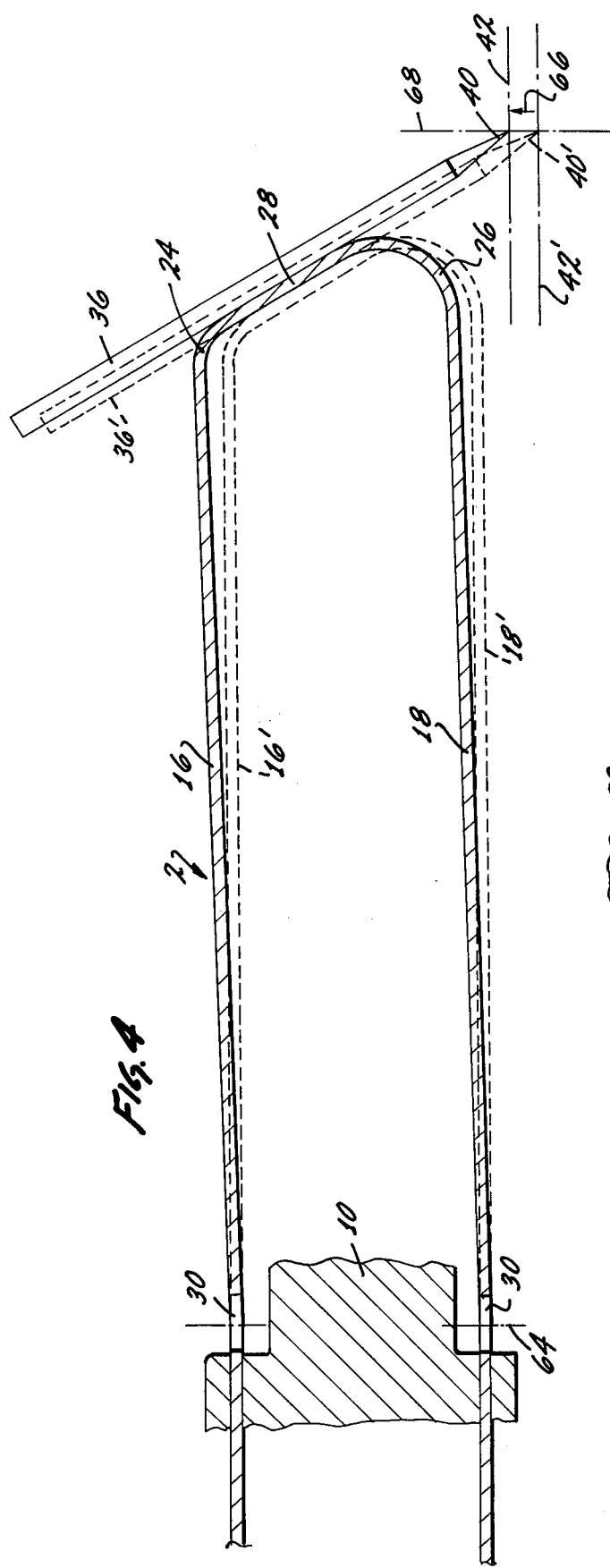
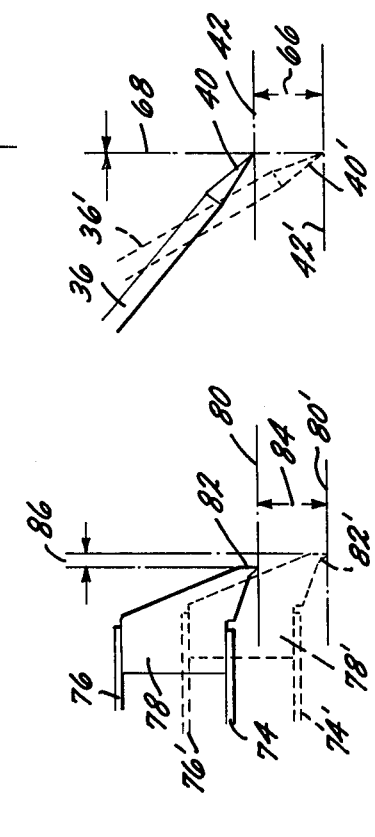
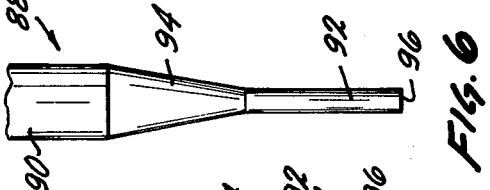
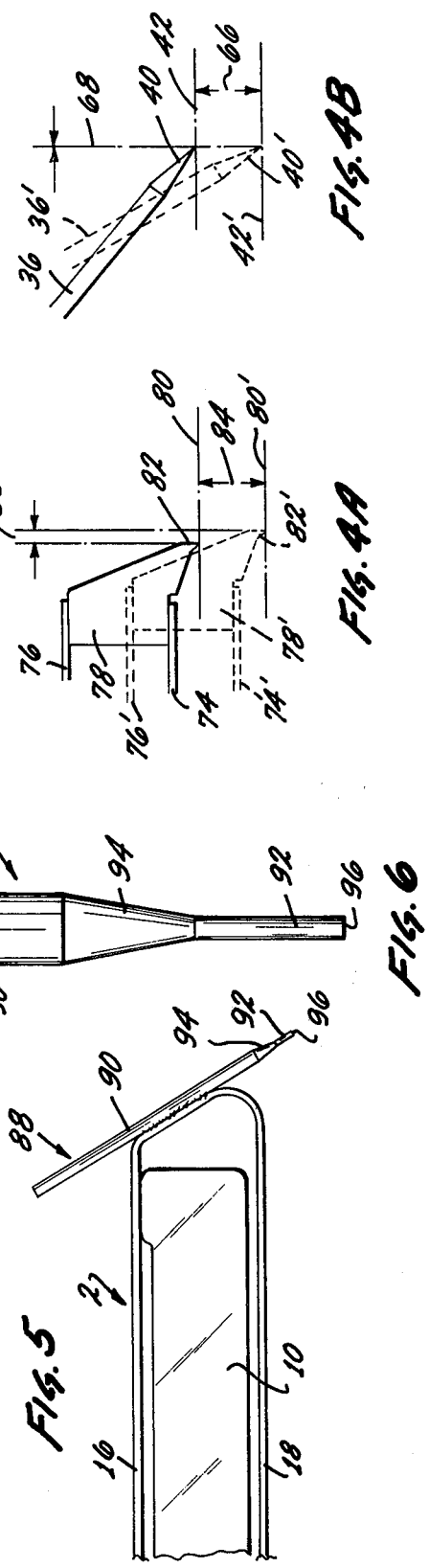

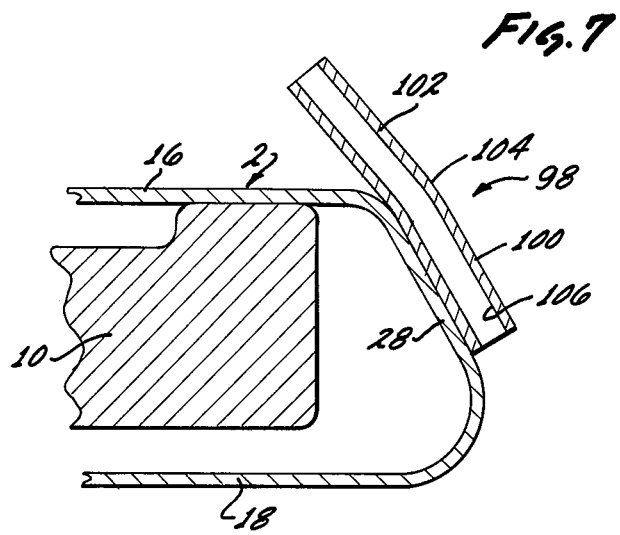
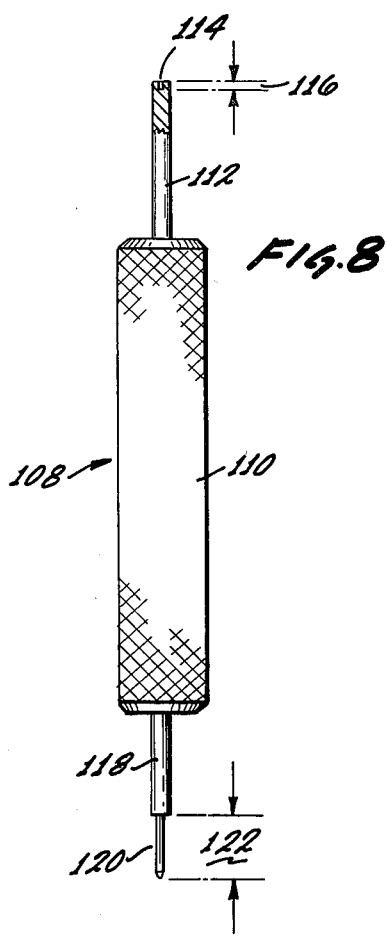
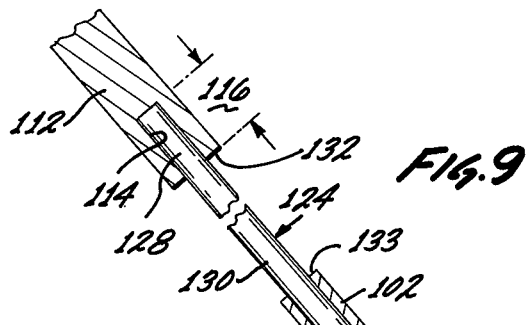
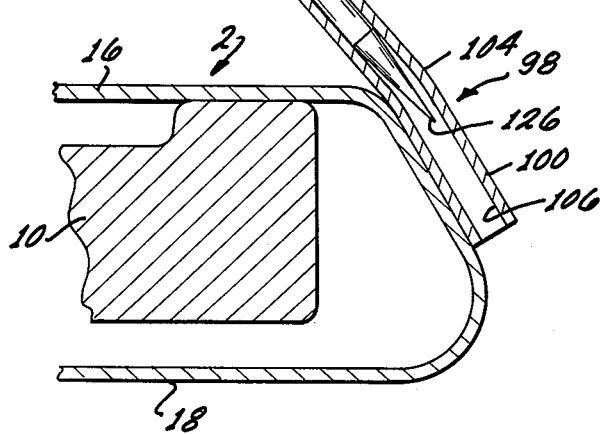
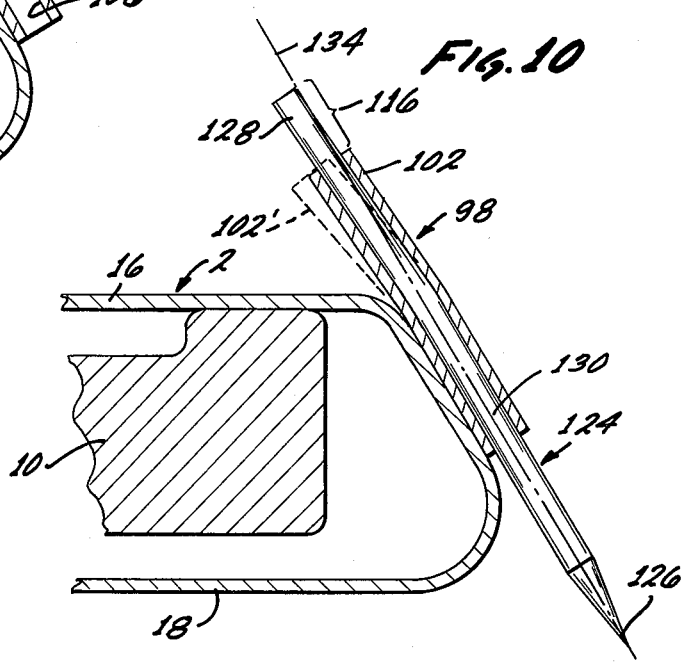

MICRO-CIRCUIT TEST PROBE

PRIOR APPLICATIONS

This application is a continuation of my prior U.S. application Ser. No. 447,865, filed Mar. 4, 1974, which is a continuation-in-part of my prior U.S. application Ser. No. 436,844, filed Jan. 28, 1974 now U.S. Pat. No. 3,939,414. Additionally, reference is made herein to my prior U.S. application Ser. No. 366,421, filed June 4, 1973. The disclosures of both prior applications are herein incorporated by reference.

BACKGROUND OF THE INVENTION

In the formation of electronic circuits, integrated circuits or micro-circuits may be fabricated from thin semiconductor slices having a multiplicity of individual matrices or micro-circuits thereon. In usual practice, the slices contain multiple identical repeating matrices of the same type of micro-circuit or integrated circuit unit. The individual unit is sometimes referred to as an integrated circuit chip.

The present practice is to test each of the circuits of each integrated circuit chip formed on the semiconductor wafer prior to separating the wafer into the desired individual integrated circuit components. In some instances, an individual integrated circuit unit may contain multiple circuits, and it is therefore desirable to test each of the circuits of the integrated circuit unit before the wafer is cut into the individual integrated circuit units.

Since each micro-circuit of each wafer is normally positioned in a predetermined precise relation with respect to adjacent circuit units, it is possible to test the circuitry if a probe can be accurately located on each preselected point that corresponds to the circuit to be tested. It is possible, for example, to test several different circuits at the same time, or the same circuit of several different integrated circuit units. Thus, it is possible that adjacent probe arms may be positioned relatively closely to each other, in which event any capacitive coupling between adjacent probes should be avoided to obtain reliable test data.

The positioning of the probes must be quite accurate and also adjustable such that different integrated circuit units may be tested. Once the probes have been properly oriented, the wafer may then be stepped or moved from position to position so that each micro-circuit is properly located relative to the cooperative probe units for appropriate testing.

One of the difficulties experienced in the use of testing probes is that the point of the probe tip may form a scratch on the surface of the semiconductor wafer as it is contacted by the point. The semiconductor wafer is generally mounted on a platform that may be positioned precisely by an X-Y positioner relative to test probes which are fixedly mounted above the plane of the platform. When the platform has been moved to a desired position, the platform is then raised to bring specific locations on the surface of the semiconductor wafer into contact with the probe tips positioned above the platform. The probe tips are generally supported on the testing probes by an arm or arms such that a probe tip may move upwardly during contact of its point with the surface of the semiconductor wafer.

During upward movement of a probe tip with its point in contact with a semiconductor wafer, the point of the tip may undergo arcuate movement due to bending of the arm or arms that support the probe tip. As the point of the probe tip is moved arcuately, the point has both horizontal and vertical components of movement. The horizontal component of movement of the point is undesirable since this causes the point to move transversely relative to the surface of the semiconductor wafer to form a scratch on the surface. Such scratches are referred to as arcing of the semiconductor surface.

To prevent the problem of arcing during testing of integrated circuit components, it would be desirable if the probe or probe tip could be constructed such that the point of the probe tip would have essentially no horizontal movement during upward movement of the probe tip when in contact with the surface of a semiconductor wafer. This would maintain the point of the probe tip at the desired contact location on the surface of the semiconductor wafer without producing scratches or arcing of the surface.

A further problem which has been experienced in testing integrated circuit units has involved wearing of the point of a probe tip during repeated contacts of the point with surfaces of semiconductor wafers being tested. In probing a precisely positioned location on the surface of the semiconductor wafer, it is, of course, necessary that the point of the probe tip provide a small area which remains relatively constant in size during repeated probings. As the point of the probe tip begins to wear, the area on the integrated circuit that is contacted by the point may increase in size which is undesirable since this destroys the accuracy of the probing operation in which only a specific location on the surface of the semiconductor wafer is to be contacted. For this reason, it may be necessary to periodically replace probe tips when they become worn.

As stated, the test probes are generally mounted in a fixed position above the plane of a platform which supports a semiconductor wafer. In replacing a probe tip, it may be necessary to replace an entire test probe since the probe and probe tip may form an integral structure. When a test probe is replaced, it is necessary to reposition the probing apparatus accurately before its further use. During repositioning, it must be determined that the replacement probe is accurately positioned in the same location as the previous probe so that the replacement probe will contact the same desired location on the semiconductor wafer. The replacement of a test probe having a dulled tip is, thus, a time consuming operation.

In view of the time which is lost in repositioning a replacement test probe, it would be desirable if a test probe could be devised in which replacement of the probe would not be required merely because the point of the probe tip had become dulled. In accomplishing this result, it would be desirable if the element forming the point of the probe tip could be replaced without removing or replacing the test probe itself. If the element could simply be replaced by a sharp element positioned in the same precise location as the dulled element, this would result in a great savings in time by eliminating the time required to reposition a replacement test probe.

When the probe tip forms a point, such as a conical point, the area presented by the probe tip will vary in size depending upon the degree of wear or dullness of the point. This, then, makes it necessary to replace the element forming the point of the probe tip at regular intervals so that the area presented by the point remains relatively constant.

To alleviate the need for periodically changing the element that forms the point of a probe tip or of changing the test probe itself, it would be desirable if the element forming the point would present an area that remained relatively constant and did not change with wear of the tip. The element forming the point or the test probe itself would then not have to be replaced as frequently and the probing apparatus could be used more efficiently.

SUMMARY OF THE INVENTION

In providing a solution to the aforementioned problems, the present invention pretains, in part, to a probe for testing integrated circuit components in which the point of the probe tip undergoes substantially vertical movement when the probe is contacted by a semiconductor wafer supported on a platform which is moved upwardly against the point of the probe tip. With the point of the probe tip undergoing substantially vertical movement, there is less tendency for arcing of the surface of the semiconductor wafer due to horizontal movement of the point of the probe tip during upward movement of the semiconductor surface against the probe tip.

In the present probe, conductive arms are supported by a dielectric support body with the arms, in turn, being connected at their outer ends to a probe tip having a downwardly positioned point for contact with a semiconductor wafer. The conductive arms include a longer arm and a shorter arm with the shorter arm being positioned above the longer arm and in spaced relation thereto. Each of the arms are connected at their inner ends to the dielectric support body. Thus, when the conductive probe tip undergoes upward movement caused by contact with a semiconductive wafer, the outer ends of the shorter and longer arms connected to the probe tip each undergo arcuate movement in separate arcuate paths.

The outer end of the shorter arm will undergo movement in an arcuate path having a shorter radius than the radius of the arcuate path of movement of the outer end of the longer arm. Since the ends of the arms are connected together, both ends move through essentially the same distance in their separate arcuate paths, except for some minor difference in their distance of movement which may result from slight elastic deformation of the arms. To provide essentially the same distance of movement to the outer end of the shorter arm that is experienced by the outer end of the longer arm, it is necessary that the shorter arm move through a greater angle than the longer arm. Accordingly, the outer end of the shorter arm has a horizontal component of movement which is greater than the horizontal component of movement of the outer end of the longer arm.

The relative positions of the outer ends of the conductive arms determine the angle made by the point of the probe tip with respect to a semiconductor surface in contact with the point. Thus, the greater horizontal component of movement experienced by the outer end of the shorter arm results in a change in the angle of the point of the probe tip with respect to the semiconductor surface. This provides an outward horizontal movement to the point of the probe tip that compensates for horizontal inward movement of the point due to the arcuate paths of movement of the ends of the shorter and longer arms. The compensating outward horizontal movement of the point tends to keep the point in a substantially vertical line of movement. Thus, there is little or no relative horizontal movement between the point of the probe tip and the semiconductor surface. Arcing of the probe tip on the semiconductor surface is, thereby, substantially reduced or eliminated.

In a further aspect of the invention, a probe is provided in which the element that contacts the semiconductor surface is replaceable without replacement of the probe itself. To provide this result, the probe tip may include a thin-walled tube and a replaceable test needle that is frictionally held within the tube. The tube is positioned relative to a dielectric support for the probe and the frictional force between the needle and the tube is sufficient to maintain the position of the needle with respect to the tube when the needle is brought into probing contact with a semiconductor surface. In holding the test needle in frictional engagement with the tube, the thin-walled tube may be bent at a bend line with the thin-walled tube being resiliently straightened by insertion of the test needle within the tube. The straightening of the thin-walled tube may, thereby, create a frictional force between the tube and test needle to frictionally position the needle with respect to the tube. Both the tube and needle are constructed such that resilient straightening of the tube is obtained without exceeding the elastic limits of the tube or needle.

In another aspect of the invention, a test needle is provided which has a point positioned at one end with the point having a configuration which provides a cross-section that remains relatively uniform during wear of the point. Desirably, the point of the needle has a cylindrical configuration. Thus, during wear of the needle, the contact area provided by the needle point remains relatively constant. The needle may, therefore, be used for a longer period of time in probing a semiconductor surface before replacement of the needle is required.

When a test needle is positioned within a thin-walled tube in frictional engagement therewith, it is desirable that the needle be very precisely positioned with respect to the tube with the needle point in a precise location for contact with a semiconductor surface. To precisely position a needle with respect to the thin-walled tube, a tool is provided which includes a shaft having a blind bore at one end. The blind bore has a diameter which provides close fitting engagement with the test needle and the blind bore has a predetermined depth which is precisely related to the required position of the test needle within the thin-walled tube.

A bearing surface is formed about the opening to the blind bore. In use, a portion of the test needle may be positioned within the blind bore with the needle contacting the bottom of the bore. The needle, while held within the blind bore may then be moved into the thin-walled tube until the bearing surface on the tool makes contact with the end surface of the thin-walled tube. At this point, the needle is precisely positioned with respect to the tube and the blind bore may be disengaged from the test needle.

Additionally, the tool for inserting a test needle within a thin-walled tube may include a second shaft having a reduced diameter portion at the end of the shaft. In removal of the test needle from the thin-walled tube, the reduced diameter portion may be inserted into the tube into contact with the test needle to apply force to the needle in moving the needle out of the tube.

THE DRAWINGS

To further illustrate the invention in terms of preferred embodiments thereof, reference is made to the accompanying drawings in which:

FIG. 1 is a perspective view of a test probe with a dielectric support body having a shortened upper arm and a lengthened lower arm supported by the body and with the arms connected by an end connection member;

FIG. 2 is a side sectional view of the test probe of FIG. 1 with a test needle secured to the end connection member and the upper arm supported through contact with a pad on the upper surface of the dielectric body;

FIG. 3 is a side sectional view, similar to FIG. 2, in which a test blade is secured to the end connection member;

FIG. 4 is a partial side sectional view of a test probe which illustrates the movement of the shortened upper arm and the lengthened lower arm to cause a change in the angular position of the test needle during its upward movement;

FIG. 4A is a fragmentary side view of a test blade supported by upper and lower arms of equal length with the point of the test blade undergoing inward horizontal movement when the test blade is moved upwardly through contact with a semiconductor surface;

FIG. 4B is a fragmentary side view illustrating upward movement of a test needle supported in the manner shown in FIG. 4 with the angle of the needle changing during its upward movement such that the point of the needle does not undergo horizontal movement with respect to a semiconductor surface in contact with the needle point;

FIG. 5 is a partial side view of a test probe with a test needle having a point that provides a relatively uniform contact area during wear of the needle point;

FIG. 6 is an enlarged detail view of an end portion of the test needle of FIG. 5 in which the needle has a cylindrical point;

FIG. 7 is a partial side sectional view of a further embodiment in which a thin-walled tube is secured to the end connection member of the test probe for receipt of a test needle that is frictionally secured within the thin-walled tube;

FIG. 8 is a front elevational view, partially in section, of a tool for inserting a test needle within the thin-walled tube of FIG. 7 or for removing a test needle from the thin-walled tube;

FIG. 9 is a side sectional view, similar to FIG. 7, illustrating the use of a tool to insert a test needle within the thin-walled tube with the position of the test needle being fixed with respect to the thin-walled tube, and FIG. 10 is a side sectional view, similar to FIG. 9, which illustrates partial straightening of a bent portion of the thin-walled tube by insertion of the test needle with straightening of the tube providing a frictional force that secures the test needle within the thin-walled tube.

DETAILED DESCRIPTION

FIG. 1 illustrates a test probe 2 of the invention having a dielectric support body 4, a shank 6 of generally rectangular cross-section and apertures 8 through the shank for securing the test probe in a fixed position. The dielectric body 4 also includes a tapered nose portion 10 whose cross-sectional area is progressively reduced between a transition line 12 and an outer end 14. A shortened upper arm 16 and lengthened lower arm 18 are mounted on support body 4 with the arms secured to the support body through engagement with slots 20 and 22.

As shown, the width of both conductive upper arm 16 and conductive lower arm 18 is progressively reduced in proceeding from transition line 12 toward outer end 24 of the upper arm and outer end 26 of the lower arm. In the probing of the semiconductor test surface, several individual test probes 2 may be placed relatively close together. By progressively reducing the thickness of the conductive arms 16 and 18 and also reducing the cross-sectional area of nose portion 10, capacitive coupling between test probes 2 due to close placement is essentially eliminated.

The shortened upper arm 16 and lengthened lower arm 18 may be connected at their outer ends 24 and 26 by an end connection member 28. Preferably, the end connection member 28 is curved at its points of connection to the outer ends 24 and 26 such that the jointure between the end connection member and the arms forms smooth curved surfaces. This reduces the stress concentration at the points of jointure. Most preferably, the upper and lower arms 16 and 18 and the end connection member 28 are formed from a single piece of metal which is bent at the outer ends 24 and 26 to provide curved transition surfaces between the arms and the end connection member.

As will be described, a probe tip may be secured to the end connection member 28 through an electrically conductive connection such as by soldering. When the probe tip is contacted by a semiconductor test surface, the probe tip may then be moved upwardly through bending of the upper and lower arms 16 and 18. To concentrate bending of the arms 16 and 18 at their inboard regions, the arms may contain holes 30 positioned adjacent to the connection of the arms to the body 4 through slots 20 and 22. When the arms 16 and 18 are bent upwardly, maximum bending, thus, occurs at the reduced cross-sectional areas provided by holes 30. Terminals 32 and 34 secured to the support body 4 are connected respectively to upper arm 16 and lower arm 18 in a manner to be described.

FIG. 2, which is a side sectional view of the test probe 2, illustrates the manner in which the shortened upper arm 16 and lengthened lower arm 18 are supported by the body 4 with the arms providing support for a test needle 36 secured to the end connection member 28 by a solder connection 38. The test needle 36 includes a conical point 40 in contact with a semiconductor surface 42. The semiconductor surface 42 will generally be positioned horizontally, as described previously, by a platform on which the semiconductor wafer is supported. During probing of semiconductor surface 42 by the test needle 36, it may frequently be desirable to observe the exact contact location of the needle point 40 with the semiconductor surface. The contact location may be viewed, for example, through a microscope positioned above the test probe 2 in a conventional manner. To observe the exact contact location of point 40 with surface 42, it is necessary that the test needle 36 be positioned at an acute angle, indicated as 44, with respect to the surface. This position of the needle 36 does not interfere with the view of the contact location through a microscope.

When the point 40 makes initial contact with the semiconductor surface 42, the surface will be moving upwardly against the point which may cause the needle 36 and arms 16 and 18 to move upwardly through bending of the arms. To increase the contact accuracy between point 40 and the semiconductor surface 42, it is desirable that the needle 36 have an initial resistance to movement which must be overcome before the needle is moved upwardly. To provide an initial resistance to movement, arms 16 and 18 may be initially bent downwardly such that the arms are spring loaded against nose portion 10. A desirable preloading of arms 16 and 18 may provide an initial preload force to the needle 36 of about 4½ grams. When the semiconductor surface 42 contacts point 40, the needle 36 will, then, not move upwardly until the upward force exceeds the preload of about 4½ grams. After the preloading force has been exceeded, the needle may then move upwardly from its rest point. A suitable spring force on the needle, after overcoming the initial preloading, may be about 0.5 grams of force per mil of needle overtravel.

To accurately position the upper arm 16 and lower arm 18 with respect to support body 4, the upper surface of the nose portion 10 may be recessed at 46 and an upwardly extending pad 48 may be formed adjacent the end 14 of the nose portion. By placing the pad 48 at the end 14 of nose portion 10, the shortened upper arm 16 may be very accurately positioned with respect to support body 4 since the position of the pad and the outer extremity of slot 22 fix the position of the entire length of the upper arm with respect to the support body. By fixing the position of shortened upper arm 16, the position of the lowered arm 18 is also fixed since it is connected to the upper arm through end connection member 28. As illustrated, there is a space 50 between the lengthened lower arm 18 and the bottom surface of the nose portion 10. The size of the space 50 is sufficient to accommodate the maximum upward movement of lower arm 18 with respect to the nose portion 10 during contact of the test needle 36 with a semiconductor surface 42.

As described, the shortened upper arm 16 is connected to lengthened lower arm 18 by means of the end connection member 28. It should be emphasized, however, that the upper and lower arms 16 and 18 need not be formed integrally with an end connection member, such as member 28. For example, the shortened upper arm 16 and the lengthened lower arm 18 may each be joined to a probe tip, such as the needle 36, with the probe tip itself forming the connection between the upper and lower arms.

The terminal 34 forms a contact 52 with lower arm 18 while a hole 54 in the upper arm 16 surrounds the terminal and prevents contact between the terminal and the upper arm. Similarly, the terminal 32 forms a contact 56 with the upper arm 16 but is not connected with lower arm 18 by reason of a hole 58 in the lower arm which surrounds the terminal. When a voltage is fed to one of the terminals, e.g., terminal 34, with the point 40 in contact with surface 42, current flows to the needle 36 through soldered connection 38 and into an integrated circuit in surface 42. The voltage at the needle 36 is then read through arm 16 and terminal 32. If the voltage at the needle 36 is not the desired value, the voltage input to terminal 34 is increased or decreased, as necessary, to correct the voltage at the needle. The voltage sensing line, e.g., including arm 16 and contact 32, includes a high impedance such that the current flow in this line is of a very low magnitude.

Other probes 2 which are in contact with surface 42 may receive the electrical signal received through the integrated circuit under test. The received signal may be sensed at the test needle through a high impedance line, which may include one of the arms 16 or 18. The arms 16 and 18 and terminals 32 and 34 form a Kelvin lead whose usage is conventional in testing micro-circuits.

FIG. 3 illustrates a test probe 2 which employs a test blade 60 in lieu of the test needle 36 as described in regard to FIG. 2. The test blade 60 may be secured to end connection member 28 through any convenient means, such as soldering, to form an electrically conductive connection between the blade and end connection member. The blade 60 includes a point 62 which functions in a similar manner to the point 40 on test needle 36 in contacting a semi-conductor surface 42. Test blades, such as blade 60, and test needles, such as needle 36, have been used in connection with test probes. The present test probe does not require a particular type of probe tip and, thus, includes the use of needles, blades, etc., as the tip element.

FIG. 4 illustrates the functioning of the present test probe 2 during upward movement of the test needle 36 with the point 40 in contact with a semiconductor surface 42. As will be described, the present test probe functions to prevent scratching or arcing of the semiconductor surface during its contact with the point of the probe tip. This is very desirable because scratching of the semiconductor surface 42 may introduce errors into the micro-circuits being probed.

The position of the shortened upper arm is shown in phantom line drawing at 16' with the position of the lengthened lower arm being shown in phantom line drawing at 18' when the needle is first contacted by the semiconductor surface. The needle is shown in phantom line drawing at 36' with point 40' contacting the semiconductor surface 42' when initial contact is made between the point and the semiconductor surface. During probing of the semiconductor surface, the surface may move from its initial contact position 42' to a new position 42. During this movement, the upper and lower arms move from their positions 16' and 18' to new positions shown in solid line drawing as 16 and 18. As this occurs, the upper and lower arms 16 and 18 undergo bending with respect to a bending axis 64 which corresponds to the center line through the holes 30 in the upper and lower arms.

The vertical movement of the semiconductor surface 42 is indicated by arrow 66 with the test needle being shown in solid line drawing at 36 with point 40 in contact with surface 42 in its raised position. During upward movement of the test needle 36, it is desirable that its point 40 move only vertically along a vertical line of movement 68. This would eliminate any scratching or arcing of the test surface 42 caused by horizontal movement of the point 40 with respect to the test surface.

During upward movement of the test needle to its solid lin position 36, the outer ends 24 and 26 of arms 16 and 18 undergo movement in separate arcuate paths. The arcuate movement of the outer ends 24 and 26 during movement of the arms from their phantom line locations 16' and 18' to their solid line locations 16 and 18 provides both a horizontal component of movement and a vertical component of movement to the outer ends.

Since the outer ends 24 and 26 are connected, either by the end connection member 28 or through direct connection to a probe tip, the outer ends both move through the same distance in their separate arcuate paths. The outer end 26 of the lengthened lower arm 18 moves in an arcuate path whose radius is determined by the length of the lower arm while outer end 24 of the shortened upper arm 16 moves in an arcuate path whose radius is determined by the length of the upper arm. Since the length of arcuate movement of the two ends 24 and 26 is the same, the shortened upper arm 16 necessarily moves through a greater angle than the lower arm 18. This provides a horizontal component of movement to the outer end 24 which is greater than the horizontal component of movement of outer end 26. As a result, the angle that the test needle 36 makes with the semiconductor surface 42 is decreased as the needle moves upwardly. The point 40 of the needle 36 is, thus, moved slightly to the right as shown in FIG. 4 during upward movement of the needle to provide an offsetting outward movement to the needle point which tends to maintain the needle point in the vertical line of movement 68. As a result, scratching or arcing of the semiconductor surface 42 through horizontal movement of the needle point 40 with respect to the surface is reduced or eliminated.

FIG. 4A is a partial side view of a test blade 78 supported in a conventional manner by arms 74 and 76 of equal length for probing a semiconductor surface 80. The blade is depicted in phantom line drawing as 78' when first contacted by upward movement of the semiconductor surface indicated as 80'. At the time of initial contact, the position of the arms as indicated in phantom line drawing as 74' and 76' and the point of the blade is indicated as 82'. On vertical upward movement of the semiconductor surface through a distance 84, the semiconductor surface reaches a solid line position indicated as 80 while the blade reaches a solid line position 78, and the arms, in turn, reach solid line positions 74 and 76.

As a result of the upward movement of the blade to its position 78, the point of the blade is moved to a solid line position 82 and moves inwardly with respect to surface 80 through a horizontal distance 86. The horizontal movement 86 of the blade point 82 while in contact with surface 80 will produce a scratch or arcing of the test surface. This is the manner in which present test probes function. However, in the present test probe 2, horizontal movement of the point 40 in contact with the semiconductor test surface 42 is greatly reduced or eliminated to substantially reduce or prevent the scratching or arcing of the semiconductor test surface.

By way of contrast, the fragmentary side elevational view shown in FIG. 4B demonstrates the functioning of a probe tip element, such as needle 36 or a test blade during its upward movement when supported by a shortened upper arm 16 and a lengthened lower arm 18. As illustrated, the test needle occupies the phantom line position 36' when point 40' is first contacted by test surface 42'. On upward movement of the test surface through distance 66 to the new position 42, the angle of the needle 36 with respect to the test surface is reduced which provides a compensating outward movement to the needle point 40 such that it tends to remain in the vertical line of movement 68. As a result, the normal horizontal movement of a probe tip, shown as 86 in FIG. 4A, is eliminated or reduced such that the test surface 42 is not scratched or arced during probing.

FIG. 5 is a partial side elevation of a test probe 2, as described previously, having a test needle 88 with a cylindrical point 92. An enlarged detail view of the front portion of the needle 88, shown in FIG. 6, illustrates the cylindrical point 92 connected to a needle shank 90 through a transition section 94. The needle point 92 provides an end area 96 which may be employed for probing a semiconductor test surface. Since the cross-sectional area of the needle point 92 will remain essentially uniform during wear of the needle point, there is less tendency for the point to become dulled, as in the case of a conical needle point such as point 40 shown in FIG. 4. Thus, the test needle 88 may be used for longer periods of time before replacement is necessary.

FIG. 7 is a partial side sectional view of a test probe 2, as described previously, which is designed for use with a replaceable probing element, such as a test needle. As illustrated, a thin-walled tube 98 is connected to end connection member 28 by any suitable means, such as soldering, to provide electrical continuity between the end connection member and the thin-walled tube. The tube 98 includes a straight section 100 and a bent section 102 with the bend line 104 positioned upwardly from the point of connection between the tube and the end connection member. As indicated, the tube 98 includes an inner wall surface 106 which is smooth and uniform even at the bend line 104.

In using the test probe of FIG. 7, a test needle may be inserted within the thin-walled tube 98 with the exterior surface of the needle in close fitting engagement with the inner wall surface 106. During insertion of the test needle within the tube 98, the tube is straightened to impart a frictional force between the inner wall surface 96 and the exterior surface of the needle which is sufficient to maintain the test needle in its proper position during probing of a semiconductor surface.

FIG. 8 illustrates a tool generally designated 108 which may be used for inserting a test needle within the thin-walled tube 98 and for removing a test needle from the thin-walled tube. The tool 108 includes a handle 110 having a shaft 112 extending from one end. The shaft 112 has an axial bore at its outer end as shown in partial section with the bore having a depth designated 116. The precise depth 116 of the bore 114, as will be described, enables precise positioning of a test needle within the thin-walled tube 98 as required for proper contact of th point of the needle with the semiconductor surface.

The tool 108 also includes a shaft 118 at its other end with the shaft 118 including a reduced diameter portion 120 having a length 122. During removal of a test needle from the thin-walled tube 98, the needle may be moved by hand relative to tube 98 until the upper end of the needle is flush with the upper end surface of the thin-walled tube. The reduced diameter portion 120 may then be inserted within the bore of the tube 98 to make contact with the upper end of the test needle. A downward force may then be exerted on the test needle by pushing the reduced diameter portion 120 into the bore of the tube 98 against the needle. The reduced diameter portion 120 may be introduced into the bore of the tube 98 to a depth permitted by the length 122. The forward portion of the needle may then be grasped by the fingers and the needle pulled out of engagement with the inner wall surface 106 of thin-walled tube 98.

FIG. 9 is a partial side sectional view of a test probe 2 shown in FIG. 7 with a test needle 124 partially inserted within the bore of the thin-walled tube 98. The needle 124 includes a point 126 at its lower end, a head portion 28 at its upper end, and a shaft 130. The head portion 128 is retained within the bore 114 of tool 108 to the depth 116. When needle 124 has been inserted to a precise depth within tube 98, a bearing surface 132 on tool 108 engages an upper end surface 133 on the tube. At this point, the test needle 124 is precisely positioned within the tube 98 and the head portion 128 is disengaged from bore 114.

FIG. 10, which is a side sectional view similar to FIG. 9, illustrates the straightening of thin-walled tube 98 during insertion of the test needle 124. Before insertion of test needle 124, the bent portion 102 of the thin-walled tube 98 occupies the position shown in phantom line drawing as 102'. However, after insertion of the test needle 124, the bent portion is moved to a solid line position 102. By resiliently moving the bent portion to solid line position 102, a frictional force is set up between the inner surface 106 of the thin-walled tube 98 and the exterior surface of the test needle 124. At the same time, the test needle 124 is also resiliently deformed to some extent. The resilient deformation of the test needle 124 with respect to a needle axis 134 is illustrated by the fact that the head portion 128 of the needle is slightly out of alignment with the needle axis.

During probing of a semiconductor surface, the probing pressure may typically be in the order of 6 to 7 grams of force applied to the point of the probe tip. Desirably, the frictional force between a replaceable test needle retained within a thin-walled tube, as described, may be about 100 grams, or at least sufficient to maintain a safety factor of about 6 or 7 in terms of the force required to displace the needle with respect to the thin-walled tube versus the designed probing pressure for the needle. In some instances, probing pressures as high as about 20 grams may be employed. With the use of higher probing pressures, the frictional force against the needle may be increased so as to maintain the desired safety factor.

Replaceable test needles, formed for example of tungsten carbide, may have an outer diameter such as about 0.03 inches or less. The outer diameter of a replaceable needle is preferably very close to the diameter of the bore in the thin-walled tube to provide close fitting engagement of the needle with the tube. Typically, difference between the outer diameter of the needle and the inner diameter of the tube will be about 0.001 inch or less.

During insertion of a replaceable needle within the thin-walled tube, both the tube and needle undergo resilient deformation which results in the frictional force between the needle and tube. Thus, while the size, materials of construction and the configuration of the replaceable needle and the thin-walled tube may be varied, the size, materials of construction and configuration of the needle and tube are such that the elastic limits of the needle or tube are not exceeded during insertion of the needle in the tube.

I claim:

1. A probe for testing integrated micro-circuits comprising:
   a dielectric support body;
   conductive spring arms supported by said body;
   said arms including a longer arm and a shorter arm;
   said shorter arm being positioned above said longer arm and in spaced relation to said longer arm;
   said arms each having outer ends;
   a conductive probe tip connected to said outer ends and said probe tip including a downwardly positioned point for contact with a surface having an integrated circuit defined thereon;
   contact means cooperating with said arms and said tip to transmit an electrical signal to or from said tip;
   each of said arms having inner ends joined directly to said body with said arms having a substantial length to width ratio to permit said arms to bend with respect to said support body during upward movement of said probe tip with said point in contact with a surface having an integrated circuit defined thereon;
   the outer ends of said shorter arm and said longer arm each undergoing movement in separate arcuate paths when said arms are bent as said probe tip is moved upwardly, and
   the outer end of said shorter arm undergoing an inward horizontal movement which is greater than the inward horizontal movement of said longer arm during bending of said arms with upward movement of said probe tip,
   whereby the angle of said probe tip is decreased with respect to the surface having an integrated circuit defined thereon during upward movement of said probe tip to provide an outward horizontal movement to said point which tends to compensate for inward horizontal movement of said tip so as to prevent arcing of a surface contacted by said point by maintaining the position of said point relatively constant with respect to the surface contacted by the point.

2. The probe of claim 1 wherein
   said dielectric body has a lateral thickness which is reduced in proceeding from the inner ends of said arms to the outer ends of said arms, and
   said arms each having a lateral thickness which is reduced in proceeding from the inner ends of said arms to the outer ends of said arms.

3. The probe of claim 1 wherein said conductive arms are parallel.

4. The probe of claim 3 including
   a vertically inclined end connection joining said longer and shorter arms.

5. The probe of claim 1 wherein said arms are preloaded in a downward direction to impose an increased resistance to the initial upward movement of said probe tip.

6. The probe of claim 1 wherein said probe tip is a conductive blade joined to said arms.

7. The probe of claim 1 wherein said probe tip is a needle joined to said arms.

8. The probe of claim 1 wherein said probe tip includes
   a thin-walled tube joined to said arms, and
   a replaceable needle frictionally secured at a precise location within said tube.

9. A probe for testing integrated micro-circuits comprising:
   a dielectric support body;
   conductive spring arms supported by said body;
   said arms including a longer arm and a shorter arm;

said shorter arm being positioned above said longer arm and in spaced relation to said longer arm;

said arms each having outer ends;

a conductive probe tip connected to said outer ends and said probe tip including a downwardly positioned point for contact with a surface having an integrated circuit defined thereon;

contact means cooperating with said arms and said tip to transmit an electrical signal to or from said tip;

each of said arms having inner ends joined to said body;

a vertically inclined end connection joining said longer and shorter arms with said arms and said end connection being formed from a single piece of conductive material;

said support body including an upwardly extending pad in contact with the undersurface of said upper arm adjacent its outer end;

said lower arm positioned in spaced relation below said body;

the outer ends of said shorter arm and said longer arm each undergoing movement in separate arcuate paths when said probe tip is moved upwardly, and the outer end of said shorter arm undergoing an inward horizontal movement which is greater than the inward horizontal movement of said longer arm during upward movement of said probe tip, whereby the angle of said probe tip changes during its upward movement to provide an outward horizontal movement to said point which tends to compensate for inward horizontal movement of said tip so as to prevent arcing of a surface contacted by said point.

10. A probe for testing an integrated micro-circuit on a semiconductor surface, said probe comprising:

a dielectric support body having first and second opposite ends and having first and second opposite sides at a position displaced from the first end;

a probe tip having a point; and first and second electrically conductive support means having different lengths and disposed in spaced relationship to each other at individual distances from the micro-circuit and respectively supported at the first and second sides of the support body at the position displaced from the first end of the support body and provided with resilient characteristics and particular lengths relative to each other for flexure toward and away from the semiconductor surface, the support means being constructed to directly secure said tip to the support means for upward movement of said tip in an arcuate path directed inward toward said body and away from the micro-circuit while changing the angle between said point and the semiconductor surface in contact therewith to impart an outwardly directed horizontal movement to said point during said upward movement to compensate for inward horizontal movement resulting from the arcuate path of movement of said tip, whereby the position of said point remains relatively constant with respect to the semiconductor surface to reduce arcing of the surface during upward movement of said tip.

11. A probe for testing an integrated micro-circuit on a semiconductor surface, said probe comprising:

a dielectric support body having first and second ends and first and second sides at a position displaced from the first end of the support body;

an electrically energizable probe tip having a point; and means to support said tip with respect to said body and to maintain the position of said point relatively constant with respect to the semiconductor surface during upward movement of the semiconductor surface and upward arcuate movement of said tip with respect to said support body with said point in contact with said semiconductor surface, said support means including first and second arms having different lengths and respectively supported by said support body on the first and second sides of the support body at the position displaced from the end of said body and provided with resilient characteristics for flexure about the position of support by the body as a fulcrum, the support arms extending longitudinally from the body and supporting the probe tip and having a particular longitudinal relationship to each other to maintain the position of the point on the probe tip relatively constant with respect to the semiconductor surface during the upward movement of the tip.

12. In combination in a probe for testing integrated micro-circuits, a conductive probe tip;

a pair of arms having different lengths and disposed in spaced relationship to each other in a direction transverse to the disposition of the micro-circuits being tested and having resilient properites for flexure of each arm in an arcuate path independently of the flexure of the other arm to provide for a controlled movement of the probe tip in an arcuate path in accordance with the forces exerted by the micro-circuits against the probe tip, the pair of arms being provided with a particular longitudinal relationship to compensate for any tendency for the probe arm to move in a direction substantially parallel to the micro-circuits upon the exertion of a force by the micro-circuits against the probe arm; and dielectric means for supporting the arms to provide for the flexure of the arms in the arcuate paths, the dielectric means having first and second ends and first and second sides displaced from the first end and respectively supporting individual ones of the arms in the pair on the first and second sides at the position displaced from the end of the dielectric means.

13. The combination set forth in claim 12, wherein the arms are conductive and terminals are provided in electrical contact with the arms to introduce electrical energy to the arms and the arms are in electrical continuity with the probe tip.

14. The combination set forth in claim 12 wherein a first one of the arms is positioned above the other arm and is shorter than the other arm.

15. The combination set forth in claim 14 wherein the probe tip is supported against the first arm and the other arm for disposition at an angle relative to the micro-circuits being tested and wherein the arms flex to move the probe tip progressively toward a parallel relationship with the micro-circuits upon the exertion of progressively increased forces by the micro-circuits against the probe tip.

16. In combination in a probe for applying a probe tip to integrated micro-circuits to test the micro-circuits,
- a body made from electrically dielectic material and having first and second opposite sides and having a longitudinal configuration,
- a first arm having a longitudinal configuration and supported by the body at one side of the body at a position displaced from a first longitudinal end of the body, and
- a second arm having a longitudinal configuration and supported by the body at the other side of the body at a position displaced from the first longitudinal end of the body,
- each of the first and second arms having resilient properties for flexure about the first longitudinal end of the body as a fulcrum and for flexure independently of the flexure of the other arm and being provided with properties to support the probe tip,
- the first and second arms being provided with individual lengths to compensate for any tendency of the probe tip to move in a direction substantially parallel to the micro-circuits upon the exertion of a force by the micro-circuits against the probe tip to flex the arms.

17. In the combination set forth in claim 16,
the first and second arms being electrically conductive and
first and second electrical terminals supported by the body and respectively connected electrically to the first and second arms.

18. In the combination set forth in claim 17,
the body having a pad at the second end opposite to the first end and the first arm being disposed in contiguous relationship to the pad at one end to limit the flexure of the first arm in a direction toward the micro-circuits.

19. In the combination set forth in claim 18,
the first arm being shorter than the second arm.

* * * * *